United States Patent [19]
Chen et al.

[11] Patent Number: 6,061,260
[45] Date of Patent: *May 9, 2000

[54] BOARD MOUNTED POWER SUPPLY HAVING AN AUXILIARY OUTPUT

[75] Inventors: Shiaw-Jong Steve Chen; Feng Lin, both of Plano, Tex.

[73] Assignee: Lucent Technology Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 09/136,171

[22] Filed: Aug. 19, 1998

[51] Int. Cl.[7] .................................................. H05K 7/20

[52] U.S. Cl. ........................................ 363/141; 361/687

[58] Field of Search ................................. 363/141, 144, 363/147; 361/687, 695, 697

[56] References Cited

U.S. PATENT DOCUMENTS

| | | | |
|---|---|---|---|
| 4,635,179 | 1/1987 | Carstem | 363/70 |
| 4,670,325 | 6/1987 | Bakos et al. | 428/209 |
| 4,810,563 | 3/1989 | DeGree et al. | 428/209 |
| 5,365,403 | 11/1994 | Vinciarelli et al. | 361/707 |
| 5,422,787 | 6/1995 | Gourdine | 361/697 |
| 5,468,661 | 11/1995 | Yuan et al. | 437/40 |
| 5,526,234 | 6/1996 | Vinciarelli et al. | 361/740 |
| 5,590,032 | 12/1996 | Bowman et al. | 363/15 |
| 5,625,548 | 4/1997 | Gold et al. | 363/98 |
| 5,642,276 | 6/1997 | Lotfi et al. | 363/144 |
| 5,659,462 | 8/1997 | Chen et al. | 363/21 |
| 5,663,869 | 9/1997 | Vinciarelli et al. | 361/707 |
| 5,726,873 | 3/1998 | Gold et al. | 363/98 |
| 5,796,580 | 8/1998 | Komatsu et al. | 361/687 |

OTHER PUBLICATIONS

Douglas Dromgoole, Ashraf Lotfi, Anatoly Feygenson, Robert Frye, Byung J. Han, King Tai; "The Application of Silicon–on–Silicon MCMs to Advanced Analog Power Controllers"; IEEE 1996; pp. 55–60.

Robert C. Frye, King L. Tai, Maureen Y. Lau, Albert W. C. Lin; "Silicon–on–Silicon MCMs With Integrated Passive Components"; IEEE 1992; pp. 155–158.

T. D. Dudderar, Y. Degani, J. G. Spadafora, K. L. Tai, R. C. Frye; "AT&T μSurface Mount Assembly: A New Technology for the Large Volume Fabrication of Cost Effective Flip–Chip MCMs"; MCM 1994; pp. 266–272.

Carl Blake, Dan Kinzer, Peter Wood; "Synchronous Rectifiers Versus Schottky Diodes: A Comparison of the Losses of a Synchronous Rectifier Versus the Losses of a Schottky Diode Rectifier"; IEEE 1994; pp. 17–23.

Van A. Niemela, Wayne C. Bowman; "Comparison of GaAs and Silicon Synchronous Rectifiers in a 3.3V out, 50W DC–DC Converter"; IEEE 1996; pp. 861–867.

D. L. Plumton, H. T. Yuan, T. S. Kim, A. H. Taddiken, V. Ley, R. L. Kollman, I. Lagnado, and L. Johnson; "A Low on–Resistance, High–Current GaAs Power VFET"; IEEE 1995; pp. 142–144.

Robert Kollman, Greg Collins, Don Plumton; "10 Mhz PWM Converters With GaAs VFETs";IEEE 1996, pp. 264–269.

Robert Kollman, Guy Sills, James Yuan, Tsengyou Syau, Prasad Venkatraman, B. Jayant Baliga; "A Comparison of Silicon UMOSFETs Versus GaAs Vertical FETs for Low Voltage, Synchronous Rectification at 2.5 Mhz"; HFPC 1992; pp. 112–123.

*Primary Examiner*—Adolf Denske Berhane

[57] ABSTRACT

A power supply and a method of manufacturing the same. In one embodiment, the power supply includes: (1) a substrate, (2) a main power supply mounted on the substrate and having an input and a main output, (3) an auxiliary power supply mounted on the substrate, coupled to the input and having an auxiliary output and (4) a cooling device mount, coupled to the power supply, configured to receive and support a cooling device, the auxiliary output configured to provide electric power to the cooling device.

20 Claims, 3 Drawing Sheets

BOARD MOUNTED POWER SUPPLY HAVING AN AUXILIARY OUTPUT

TECHNICAL FIELD OF THE INVENTION

The present invention is directed, in general, to a power supply and, more specifically, to a board mounted power supply having an auxiliary output.

BACKGROUND OF THE INVENTION

The electronics industry strives to develop smaller, less expensive and more powerful components that offer more functions than previous models, which in turn, typically requires increased power. Sometimes, a component will utilize auxiliary devices to achieve a desired result or perform an additional function. Auxiliary devices may require a different voltage than the voltage supplied to the primary components. Consequently, an auxiliary power supply is often necessary to provide the correct voltage to these devices.

Auxiliary power is often provided by adding a power supply to the component or equipment. However, drawbacks to adding these power supplies are added heat, weight, volume and increased component cost. Additionally, excess heat generated by the power supply reduces the efficiency and reliability of the component. Also, additional power supplies increase the complexity of the component because of necessary wiring and circuitry. Ultimately, adding power supplies to the component creates characteristics which are detrimental to the industry goal of producing smaller, more efficient electronic components.

The telecommunications industry utilizes electronic components to power devices, such as voice processing and switching equipment. These devices may comprise several different circuit boards that are housed in a common equipment cabinet. Power is typically supplied to all of the circuitry in the device by a single board mounted power module (BMPM). Smaller BMPMs are desired because they consume less space in the cabinet and allow for smaller equipment. Also, more powerful BMPMs can supply power to a greater number of devices and consequently provide increased services to a consumer.

BMPM performance is evaluated according to its power density, which is the ratio of the total power output to the total volume of the BMPM. The industry desires the highest power density attainable or, practically, the smallest BMPM with the largest power output. However, limitations on BMPM efficiency result in excess heat generation as power output increases, which causes inefficiency, reduced reliability and premature failures. With the use of these more powerful BMPMs there is a concurrent need to remove the additional heat generated by the BMPMs.

Currently, finned heat sinks are used to dissipate heat generated by BMPMs. However, conventional finned heat sinks with external air flow are not capable of removing enough heat to allow increases in BMPM power density. Actually, additional heat dissipation requires a larger heat sink, which effectively lowers the BMPM power density.

Many computer applications utilize a heat sink/fan assembly which significantly increases heat dissipation capability. Other methods of cooling are also available. Active heat dissipation, however, requires additional power to operate the cooling equipment. Similar remedies may be utilized by the telecommunications industry but costs and complexity would escalate because an additional power supply will usually be required to operate any auxiliary equipment.

Accordingly, what is needed in the art is a method of providing power to auxiliary components without adding a separate power supply.

SUMMARY OF THE INVENTION

To address the above-discussed deficiencies of the prior art, the present invention provides a power supply and a method of manufacturing the same. In one embodiment, the power supply includes: (1) a substrate, (2) a main power supply mounted on the substrate and having an input and a main output, (3) an auxiliary power supply mounted on the power supply, coupled to the input and having an auxiliary output and (4) a cooling device mount, coupled to the substrate, configured to receive and support a cooling device, the auxiliary output configured to provide electric power to the cooling device.

The present invention therefore introduces the broad concept of powering the cooling device for a board-mounted power supply with the board-mounted power supply itself. This allows the board-mounted power supply and the cooling device to be packaged as an integral module with a single electrical input, thereby simplifying installation and connection of the module with surrounding circuitry.

In one embodiment of the present invention, the power supply further includes a cooling device coupled to the cooling device mount and the auxiliary output. Thus, the cooling device, which formed a portion of the environment within which the power supply operated in the embodiment described above, may be joined to the power supply to form an integral module.

In one embodiment of the present invention, the power supply further includes a heat sink coupled to the power supply proximate the cooling device mount. In an embodiment to be illustrated and described, the heat sink is interposed between the board-mounted power supply and the cooling device, thereby subjecting fins of the heat sink to cooling airflow.

In one embodiment of the present invention, the cooling device mount is embodied in a case substantially surrounding the substrate. The case advantageously protects the power supply from damage due to external force. The cooling device mount may be embodied as indentations in, or projections from, the case.

In one embodiment of the present invention, the auxiliary output comprises an electrical connector projecting substantially normally from a plane of the substrate. In an alternative embodiment, the substrate is mountable to a printed wiring board, the auxiliary output providable to the cooling device by way of the printed wiring board. In another alternative embodiment, the power supply further includes an auxiliary output cable coupled to the substrate and providing the auxiliary output.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
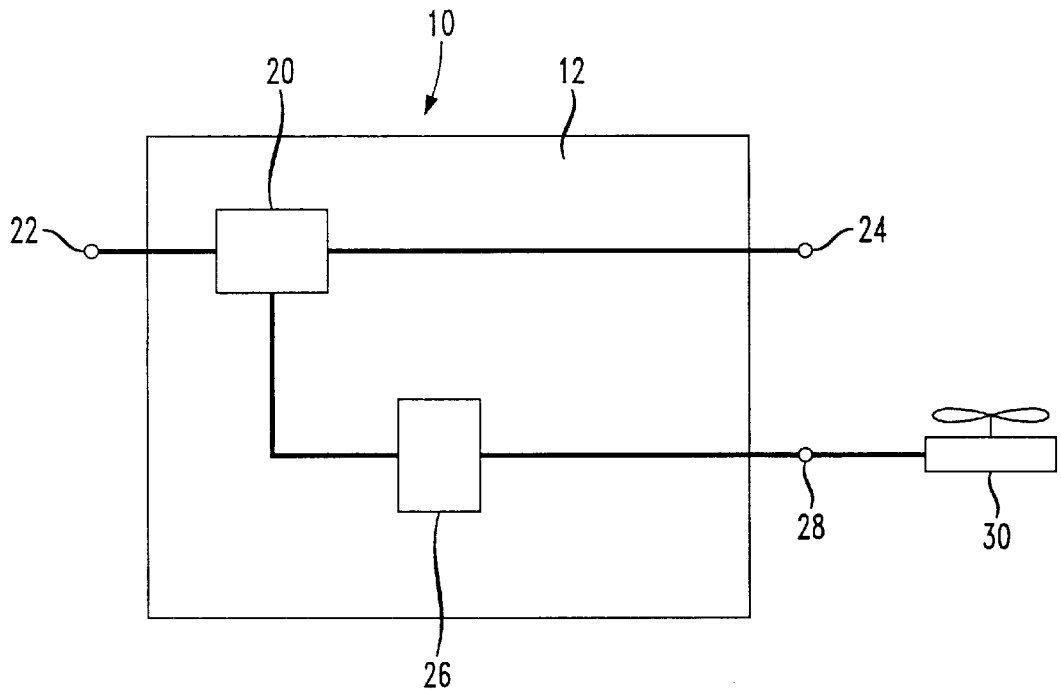
FIG. 1 illustrates a schematic view of a power supply with an auxiliary output.

Referring initially to FIG. 1, there is illustrated, in one embodiment, a power supply 10 that includes a substrate 12 and a main power supply 20, which is supported on the substrate 12. The main power supply has an input 22 and a main output 24. The main power supply 20 is designed to transform power from the input 22 into a specified power supplied at the main output 24 according to the power requirements of a particular application. For example, the main power supply 20 in an electronic cabinet may supply power to several boards of electronic components. An increase in the number of boards or electronic components may require more power at the main output 24. In such instances, the electronic circuitry within the main power supply 20 may be configured to deliver more power to the boards or components within the cabinet.

In one particular embodiment, a portion of the power delivered to the main power supply 20 is diverted to an auxiliary power supply 26 that has an auxiliary output 28. However, it will, of course, be appreciated that the auxiliary power supply 26 may receive auxiliary power from a source other than the main power supply 20. The auxiliary power supply 26 is designed to transform power from the main power supply 20 into auxiliary power, which is available at the auxiliary output 28. The electronic circuitry within the auxiliary power supply 20 may be configured to provide specifically tailored power to an auxiliary component, for example, as illustrated in this embodiment, a cooling fan 30.

Figure 2A:
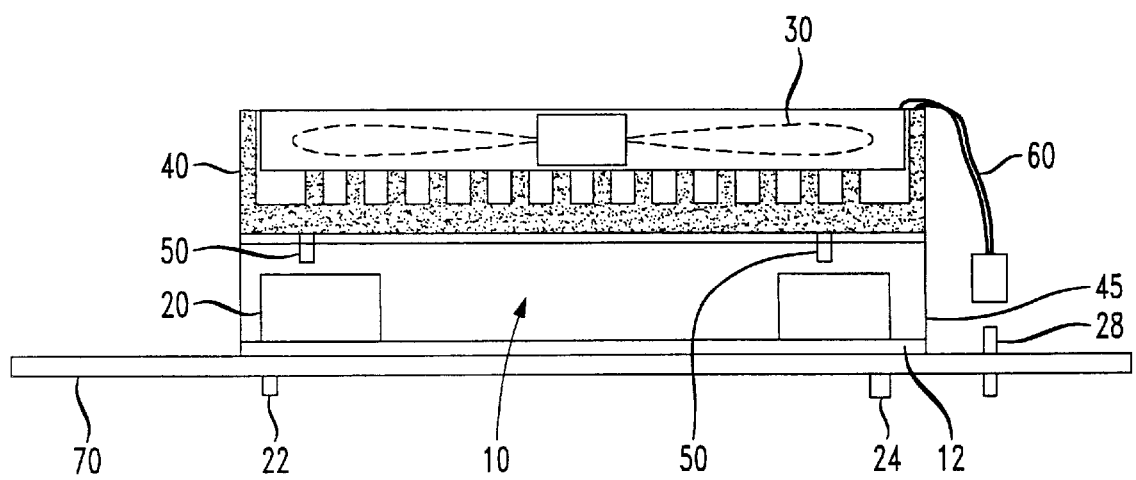
FIG. 2a illustrates a sectional elevation view of a power supply with an attached heat sink/fan assembly.

Turning now to FIG. 2a, there is illustrated, in one embodiment, a sectional view of the cooling fan 30 that is received in the heat sink 40. However, other structural configurations may also be used. For example, the cooling fan 30 may simply attach to an upper surface of the heat sink 40. The cooling fan 30 draws air across fins on the heat sink 40 to induce forced air cooling, which offers significant improvement in efficiency over cooling with either a cooling fan 30 or a heat sink 40 alone.

Figure 2B:
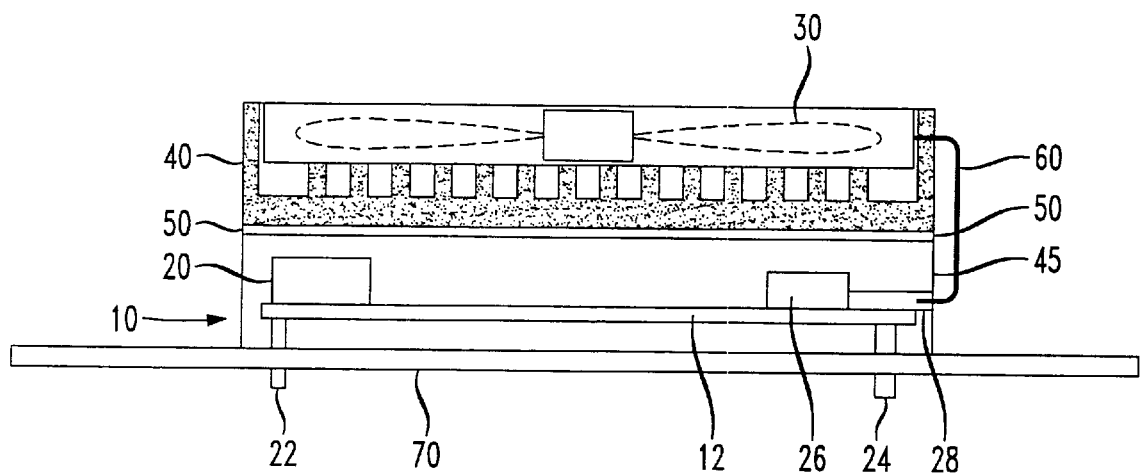
FIG. 2b illustrates a sectional elevation view of a board mounted power supply with an attached heat sink/fan assembly.

The cooling fan 30 and the heat sink 40 are coupled to a power supply case 45 by a fan mount 50. In one particular embodiment, the fan mount 50 is embodied in the power supply case 45, which substantially surrounds the substrate 12, as illustrated in FIG. 2b. The fan mount 50 encompasses various mechanical or chemical embodiments for attaching objects together. For example, the fan mount 50 may include a pin and socket system or an adhesive. What ever system is used, the fan mount 50 secures the heat sink 40 to the substrate 12 to remove heat generated by the power supplies 20, 26. The illustrated fan mount 50 comprises protrusions that extend from the heat sink 40 and cooperatively engage sockets, which are embodied within the power supply case 45, and that serve to secure the heat sink 40 to the power supply case 45. The fan mount 50 may also comprise protrusions extending from the power supply case 45 that are configured to engage sockets formed within the heat sink 40. In another embodiment, the fan mount 50 may comprise an extension of the power supply case 45, which substantially surrounds the heat sink 40 and secures the cooling fan 30 and the heat sink 40 to the power supply case 45. Many other methods of attaching the cooling fan 30 and the heat sink 40 to the substrate 12 will be apparent to one of ordinary skill in the art.

Figure 2C:
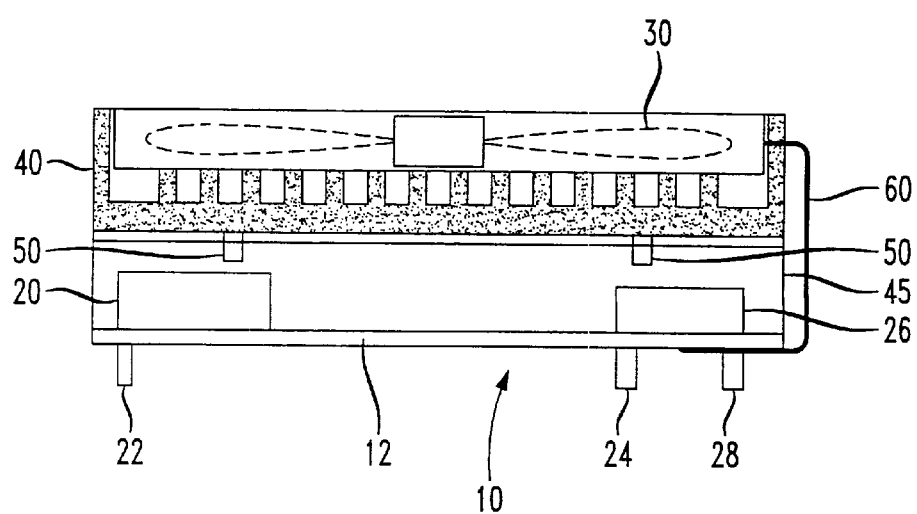
FIG. 2c illustrates a sectional elevation view of a power supply and heat sink/fan assembly.

The auxiliary output 28 supplies power to the cooling fan 30 through an electrical connector 60. In the illustrated embodiment, the auxiliary output 28 is electrically connected to the substrate 12 by a printed wiring board 70. The electrical connector 60 may be a conductive wire that electrically connects the cooling fan 30 to the auxiliary output 28 through the printed wiring board 70. FIG. 2b illustrates an alternative embodiment in which the auxiliary output 28 may be attached directly to the substrate 12 within the power supply case 45. FIG. 2c illustrates another alternative embodiment in which the electrical connector 60 attaches directly to the auxiliary output 28 that may be connected to the auxiliary power supply 26 through the substrate 12. In such embodiments, the electrical connector 60 may be a conductive strap or cable that attaches the auxiliary output 28 directly to the cooling fan 30.

The main power supply 20 is electrically connected to the printed wiring board 70 by the input 22. Power from an external source (not shown) attached to the printed wiring board 70 can be routed through the input 22 into the main power supply 20. After the power is transformed, it is returned to the printed wiring board 70 through the main output 24 to be delivered to the necessary circuits.

Figure 3:
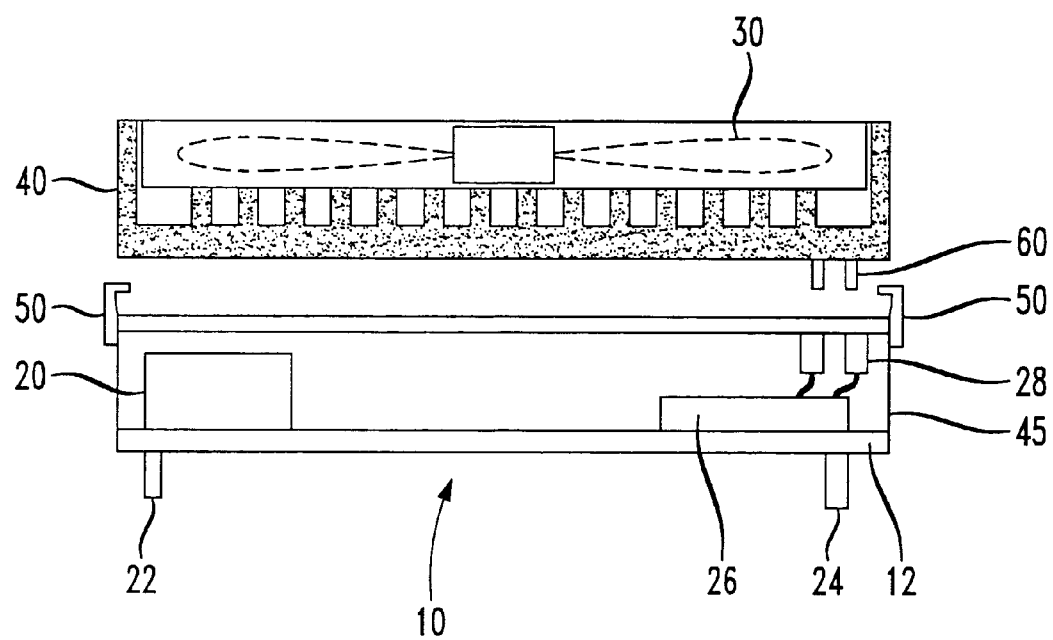
FIG. 3 illustrates a sectional elevation view of a heat sink/fan assembly and a board mountable power module.

Turning now to FIG. 3, there is illustrated, in another embodiment, the electrical connector 60 comprising conductive pins electrically connected to the cooling fan 30. The auxiliary output 28 has a socket connection to accept the conductive pins, which deliver power from the auxiliary output 28 to the cooling fan 30. In an alternative embodiment, the electrical connector 60 may be a socket and the terminus of the auxiliary output 28 may be conductive pins. In an alternative embodiment, the electrical connector 60 may be connected to the auxiliary output 28 by contact pads, which conduct power to the cooling fan 30. Regardless of a particular connection configuration, power from the auxiliary power supply 26 is transferred from the auxiliary output 28 to the cooling fan 30. Many other methods for electrically connecting the auxiliary output 28 to the cooling fan 30 will be apparent to one of ordinary skill in the art.

From the foregoing, it is readily apparent that the present invention provides a power supply and a method of manufacturing the same. The power supply may include a main power supply that is mounted on a substrate and that has an input and a main output. An auxiliary power supply is also mounted on the substrate and is coupled to the input of the main power supply and has an auxiliary output. A cooling device mount (for example, a fan) is also coupled to the substrate and is configured to receive and support a cooling device. The auxiliary output is configured to provide electric power to the cooling device. The present invention therefore introduces the broad concept of powering the cooling device for a board-mounted power supply with the board-mounted power supply itself.

Although the present invention has been described in detail, those skilled in the art should understand that they can make various changes, substitutions and alterations herein without departing from the spirit and scope of the invention in its broadest form.

What is claimed is:

1. A power supply, comprising:

a substrate;

a main power supply mounted on said substrate and having an input and a main output;

an auxiliary power supply mounted on said substrate, coupled to said input and having an auxiliary output; and a cooling device mount, proximate said substrate, configured to receive and support a cooling device, said auxiliary output configured to provide electric power to said cooling device, said power supply mountable to a printed wiring board.

2. The power supply as recited in claim 1 further comprising a cooling device coupled to said cooling device mount and said auxiliary output.

3. The power supply as recited in claim 1 further comprising a heat sink coupled to said power supply proximate said cooling device mount.

4. The power supply as recited in claim 1 wherein said cooling device mount is embodied in a case substantially surrounding said substrate.

5. The power supply as recited in claim 1 wherein said auxiliary output comprises an electrical connector projecting substantially normally from a plane of said substrate.

6. The power supply as recited in claim 1 wherein said substrate is mountable to a printed wiring board, said auxiliary output providable to said cooling device by way of said printed wiring board.

7. The power supply as recited in claim 1 further comprising an auxiliary output cable coupled to said substrate and providing said auxiliary output.

8. A method of manufacturing a power supply, comprising:

providing a substrate;

mounting a main power supply on said substrate, said main power supply having an input and a main output;

mounting an auxiliary power supply on said substrate, said auxiliary power supply coupled to said input and having an auxiliary output; and coupling a cooling device mount proximate said substrate, said cooling device mount configured to receive and support a cooling device, said auxiliary output configured to provide electric power to said cooling device, said power supply mountable to a printed wiring board.

9. The method as recited in claim 8 further comprising coupling a cooling device to said cooling device mount and said auxiliary output.

10. The method as recited in claim 8 further comprising coupling a heat sink to said substrate proximate said cooling device.

11. The method as recited in claim 8 wherein said coupling comprises embodying said cooling device mount in a case substantially surrounding said substrate.

12. The method as recited in claim 8 further comprising forming said auxiliary output with first and second pins projecting substantially normally from a plane of said substrate.

13. The method as recited in claim 8 further comprising:

mounting said substrate to a printed wiring board; and forming said auxiliary output from an electrical connector projecting substantially normally from a plane of said printed wiring board.

14. The method as recited in claim 8 further comprising coupling an auxiliary output cable to said substrate, said auxiliary output cable providing said auxiliary output.

15. A power supply, comprising:

a substrate;

a main power supply mounted on said substrate and having an input and a main output;

an auxiliary power supply mounted on said substrate, coupled to said input and having an auxiliary output; and a cooling device mounted proximate said substrate and said auxiliary output, said power supply mountable to a printed wiring board.

16. The power supply as recited in claim 15 further comprising a heat sink interposed between said substrate and said cooling device.

17. The power supply as recited in claim 15 further comprising a case substantially surrounding said substrate.

18. The power supply as recited in claim 15 wherein said auxiliary output comprises an electrical connector projecting substantially normally from a plane of said substrate.

19. The power supply as recited in claim 15 wherein said substrate is mountable to a printed wiring board, said auxiliary output providable to cooling device by way of said printed wiring board.

20. The power supply as recited in claim 15 further comprising an auxiliary output cable coupled between said substrate and said cooling device and providing said auxiliary output.

* * * * *